United States Patent [19]
Funston

[11] 3,988,701
[45] Oct. 26, 1976

[54] OSCILLATOR FREQUENCY SWITCHING CIRCUIT FOR REMOTE CONTROL TRANSMITTER

[75] Inventor: David L. Funston, Batavia, N.Y.
[73] Assignee: GTE Sylvania Incorporated, Stamford, Conn.
[22] Filed: Dec. 8, 1975
[21] Appl. No.: 638,533

[52] U.S. Cl. ................... 331/179; 178/DIG. 15; 325/37; 331/117 R; 331/185; 340/15
[51] Int. Cl.² ............... H03B 5/12; H03J 5/32; H04B 11/00
[58] Field of Search ............ 331/117 R, 179, 185; 340/147 B, 147 C, 147 CV, 147 F, 15; 178/DIG. 15; 325/391, 37, 392; 310/8.1, 8.7; 343/228

[56] References Cited
UNITED STATES PATENTS

| | | | |
|---|---|---|---|
| 3,100,886 | 8/1963 | Marks | 340/15 |
| 3,678,392 | 7/1972 | Houghton | 325/392 |
| 3,705,363 | 12/1972 | Okada et al. | 178/DIG. 15 |
| 3,949,297 | 4/1976 | Hideshima | 325/37 |

*Primary Examiner*—Siegfried H. Grimm
*Attorney, Agent, or Firm*—Norman J. O'Malley; Robert E. Walrath; Robert T. Orner

[57] ABSTRACT

A remote control transmitter utilizing single-pole, single-throw switches for connecting frequency determining capacitors and a battery in circuit with an LC oscillator is shown. The switches can be push-button type switches which close a pair of contacts. The battery is connected in circuit with the oscillator by a semiconductor switch which is closed by closure of any one of the push-button switches. Diodes isolate the frequency determining capacitors from each other.

8 Claims, 1 Drawing Figure

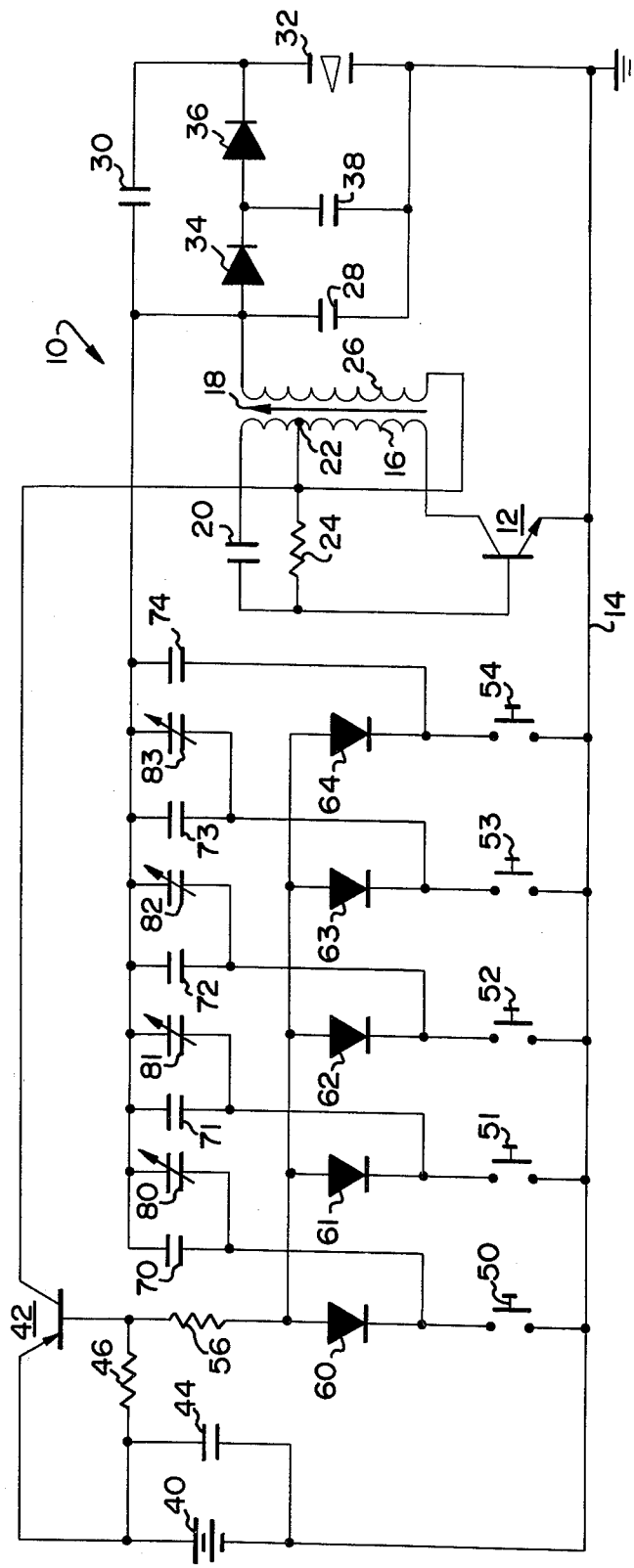

OSCILLATOR FREQUENCY SWITCHING CIRCUIT FOR REMOTE CONTROL TRANSMITTER

FIELD OF THE INVENTION

This invention relates to a remote control transmitter and more particularly to remote control transmitters activated by closure of one of a plurality of single-pole, single-throw switches.

BACKGROUND OF THE INVENTION

Remote control systems are utilized in a variety of equipment for remotely energizing or modifying the operation of such equipment. One common use for remote control systems is in connection with television receivers wherein the remote control system can be used to turn the receiver on or off, change channels, alter the volume of the sound, or the like. Typically the remote control system includes a remote transmitter and a receiver incorporated into the television receiver to control the television receiver in response to ultrasonic signals from the remote transmitter.

Since it is normally desired to move the transmitter about at will, the transmitter is battery powered. Typical prior art transmitters include an oscillator and a plurality of switches for connecting the battery to the oscillator and for connecting frequency determining elements in circuit with the oscillator. Typical prior art arrangements include multiple contact switches such that one set of contacts connects the frequency determining element in circuit with the oscillator while another set of contacts connects the battery to the oscillator. Other arrangements include a switch for connecting the power source or battery to the oscillator which is ganged with the remaining switches so that it is closed whenever one of the other switches is closed. These various prior art arrangements require substantially more complex switches thereby unduly increasing the expense of the remote transmitter. Furthermore, the prior art arrangements provide limited design and styling options which unduly limit the marketability of remote control transmitters and equipment used therewith.

OBJECTS OF THE INVENTION

Accordingly, it is a primary object of this invention to obviate the above-noted and other disadvantages of the prior art.

It is a further object of this invention to provide a novel remote control transmitter.

It is a further object of this invention to provide a relatively inexpensive remote control transmitter.

It is a further object of this invention to provide a remote control transmitter with enhanced design and styling flexibility.

It is a further object of this invention to provide a remote control transmitter which utilizes single-pole, single-throw switches as the user operative elements.

SUMMARY OF THE INVENTION

The above and other objects and advantages are achieved in one aspect of this invention by a remote control transmitter which includes an oscillator and a battery which has a first terminal connected by a common conductor to the oscillator. A semiconductor switch has an input terminal connected to a second terminal of the battery and an output terminal connected to the oscillator. Each of a plurality of single-pole, single-throw switches has a first contact connected to the common conductor. Means connecting a second contact of each of the plurality of switches to the semiconductor switch close the semiconductor switch when one of the plurality of switches is closed. A plurality of frequency determining means are each connected to the oscillator and to a respective one of the second contacts for causing the oscillator to provide a signal with a corresponding discrete frequency when one of the plurality of switches is closed.

BRIEF DESCRIPTION OF THE DRAWING

The single FIGURE is a schematic illustration of a remote control transmitter incorporating one embodiment of the invention.

DETAILED DESCRIPTION OF THE PREFERRED EMBODIMENT

For a better understanding of the present invention, together with other and further objects, advantages and capabilities thereof, reference is made to the following disclosure in conjunction with the accompanying drawings.

In the drawing an oscillator 10 for providing a plurality of signals each having a corresponding discrete frequency includes a transistor 12. Transistor 12 has an emitter connected to a common conductor 14 illustrated as circuit ground. A collector of transistor 12 is connected to one end of a winding 16 of a tunable transformer 18. The other end of winding 16 is connected by a capacitor 20 to a base of transistor 12. A tap 22 on winding 16 is connected by a resistor 24 to the base of transistor 12.

Tap 22 is further connected to one end of a secondary winding 26 on transformer 18. The other end of secondary winding 26 is connected by a capacitor 28 to circuit ground. A capacitor 30 and a transmitting means illustrated as an ultrasonic transmitter or transducer 32 are connected in series from the second end of winding 26 and circuit ground. A pair of diodes 34 and 36 are connected in series and the series combination is connected in parallel with capacitor 30 while a capacitor 38 is connected from the junction of diodes 34 and 36 to circuit ground.

Oscillator 10 is an LC oscillator which is energized by a battery 40 when battery 40 is connected between common conductor 14 and tap 22, and hence, to the collector and base biasing circuit of transistor 12. Secondary winding 26 and the capacitance in parallel therewith determine the oscillator frequency. The capacitance in parallel with winding 26 is effectively capacitor 28 and the capacitance of ultrasonic transducer 32 in series with capacitor 30 together with additional capacitance switched in parallel with capacitor 28 as will be described herein after. The output signal is coupled from secondary winding 26 via capacitor 30 to transducer 32. Transducer 32 is biased by a voltage coupled from tap 22 via secondary winding 26 and diodes 34 and 36 to transducer 32 and by the oscillator output voltage which is rectified by diode 34 and filtered by capacitor 38 which together with diode 36 comprise a voltage doubler. Those skilled in the art will realize that a resistor can be substituted for diode 36 in which case there will be no voltage doubling action.

Battery 40 has a first or negative terminal connected to common conductor 14 and a second or positive terminal connected to an input terminal of a semiconductor switch illustrated as an emitter of a PNP transistor 42 which has an output terminal illustrated as a collector connected to tap 22 of winding 16. A capacitor 44 is connected in parallel with battery 40 to filter current surges. The positive terminal of battery 40 is connected by a resistor 46 to a base electrode of transistor 42. Each of a plurality of single-pole, single-throw switches 50–54 has a first contact connected to common conductor 14. The base of transistor 42 is connected by a resistor 56 to the anodes of a plurality of diodes 60–64 each of which has a cathode connected to a second terminal of a respective one of switches 50–54. Resistor 56 together with diodes 60–64 comprise a means connecting a second contact of each of the plurality of switches 50–54 to semiconductor switch 42 for closing semiconductor switch 42 when one of the plurality of switches 50–54 is closed.

A plurality of frequency determining means illustrated as capacitors 70–74 are connected to oscillator 10 and to a respective one of the second contacts of switches 50–54. Each of capacitors 70–74 has one plate connected to the junction of winding 26 and capacitor 28 and the other plate connected to a respective one of the second contacts of switches 50–54. Trimmer capacitors 80–83 are connected in parallel with capacitors 70–73, respectively, for providing a range of frequency adjustment.

When one of the switches 50–54 is closed, the corresponding one of capacitors 70–74 is connected in parallel with capacitor 28 to vary the capacitance of the resonant circuit including secondary winding 26, and hence, the frequency of oscillator 10. Closure of one of the switches 50–54 also provides a current path from battery 40 through resistors 46 and 56 and the corresponding one of diodes 60–64 to common conductor 14 to close the semiconductor switch by turning transistor 42 on. Preferably resistors 46 and 56 have values such that transistor 42 is fully turned on to provide a low dynamic impedance. When transistor 42 is turned on, a bias voltage and current path is completed via transistor 42 and tap 22 of winding 16, and hence to transistor 12 and transducer 32 so that the oscillator and ultrasonic transmitter provide an output signal of a frequency corresponding to the closed one of switches 50–54. For example, when switch 51 is closed, diode 61 is forward biased to turn transistor 42 on and cause oscillator 10 and transducer 32 to provide an ultrasonic signal of a particular frequency. Diodes 60 and 62–64 become reverse biased by rectification of oscillator output signal coupled thereto via the respective capacitors to effectively remove capacitors 70, 72–74, 80, and 82–83 from the circuit. Accordingly, diodes 60–64 isolate capacitors 70–74 and 80–83.

In one practical embodiment of the invention used in conjunction with a television receiver, closure of switch 50 caused oscillator 10 to provide a signal at 38.75 kHz which, when received, caused the television receiver to turn on and off. Closure of switch 51 caused oscillator 10 to provide a signal at 40.25 kHz which caused the television receiver to tune to a higher frequency channel. Similarly, closure of switch 52 caused oscillator 10 to provide an output signal of 41.75 kHz to cause the television receiver to tune to a lower frequency channel. Closure of switches 53 and 54 caused oscillator 10 to provide signals at 43.25 and 37.25 kHz, respectively, which corresponded to volume down and volume up, respectively. Those skilled in the art will realize, however, that the invention is not limited to five functions and that more or fewer functions can be provided as desired or different functions can be remotely controlled if desired.

Accordingly, a preferred embodiment of the remote control transmitter in accordance with the invention has been illustrated and described. In the preferred embodiment inexpensive push-button switches can be used as switches 50–54 or other single-pole, single-throw switches can be substituted therefor in accordance with cost, design, and styling desires.

While there has been shown and described what is at present considered the preferred embodiment of the invention it will be obvious to those skilled in the art that various changes and modifications may be made therein without departing from the invention as defined by the appended claims.

What is claimed is:

1. A remote control transmitter comprising:
   an oscillator for providing a plurality of signals each having a corresponding discrete frequency;
   a battery having a first terminal connected by a common conductor to said oscillator;
   a semiconductor switch having an input terminal connected to a second terminal of said battery and an output terminal connected to said oscillator;
   a plurality of single-pole, single-throw switches each having a first contact connected to said common conductor;
   means connecting a second contact of each of said plurality of switches to said semiconductor switch for closing said semiconductor switch when one of said plurality of switches is closed; and
   a plurality of frequency determining means each connected to said oscillator and to a respective one of said second contacts for causing said oscillator to provide one of said plurality of signals when the corresponding one of said plurality of switches is closed.

2. A remote control transmitter as defined in claim 1 wherein said semiconductor switch is a transistor having a base electrode connected to each of said second contacts.

3. A remote control transmitter as defined in claim 1 wherein said means for closing said semiconductor switch includes a plurality of diodes connected between said semiconductor switch and respective ones of said second contacts.

4. A remote control transmitter as defined in claim 3 wherein said plurality of frequency determining means includes a plurality of capacitors and said diodes isolate said capacitors.

5. A remote control transmitter as defined in claim 4 wherein said semiconductor switch is a transistor having a base electrode connected to each of said diodes.

6. A remote control transmitter comprising:
   an oscillator;
   a battery having a first terminal connected by a common conductor to said oscillator;
   a semiconductor switch having an input terminal connected to a second terminal of said battery and an output terminal connected to said oscillator;
   a plurality of single-pole, single-throw switches each having a first contact connected to said common conductor;
   a plurality of diodes connected between said semiconductor switch and respective second contacts of said plurality of switches for closing said semiconductor switch when one of said plurality of switches is closed; and a plurality of frequency determining means each connected to said oscillator and to a respective one of said second contacts for causing said oscillator to provide a signal with a corresponding discrete frequency when one of said plurality of switches is closed.

7. A remote control transmitter as defined in claim 6 wherein each of said plurality of frequency determining means includes a capacitor and said diodes isolate said capacitors.

8. A remote control transmitter as defined in claim 7 wherein said semiconductor switch is a transistor having a base electrode connected to each of said diodes.

* * * * *